(12) United States Patent
Jang (10) Patent No.: US 8,575,756 B2
(45) Date of Patent: Nov. 5, 2013

(54) POWER PACKAGE MODULE WITH LOW AND HIGH POWER CHIPS AND METHOD FOR FABRICATING THE SAME

(75) Inventor: Bum Sik Jang, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 22 days.

(21) Appl. No.: 13/150,879

(22) Filed: Jun. 1, 2011

(65) Prior Publication Data

US 2012/0104621 A1     May 3, 2012

(30) Foreign Application Priority Data

Nov. 1, 2010  (KR) .................. 10-2010-0107563

(51) Int. Cl.
*H01L 23/29*       (2006.01)
*H01L 23/31*       (2006.01)
*H01L 25/18*       (2006.01)
*H01L 25/04*       (2006.01)

(52) U.S. Cl.
USPC ............ 257/773; 257/E23.01; 257/E23.06; 257/713; 257/717; 257/712; 257/E21.506; 438/118

(58) Field of Classification Search
USPC ........... 257/773, E21.506, E23.01, 712, 713, 257/717, 692, E23.06; 438/118
See application file for complete search history.

(56) References Cited

U.S. PATENT DOCUMENTS

| | | | | |
|---|---|---|---|---|
| 6,060,772 A * | 5/2000 | Sugawara et al. | ............. | 257/678 |
| 7,671,467 B2 * | 3/2010 | Nonaka et al. | ................ | 257/711 |
| 7,679,173 B2 * | 3/2010 | Uno et al. | ..................... | 257/678 |
| 7,932,588 B2 * | 4/2011 | Uno et al. | ...................... | 257/678 |
| 7,969,025 B2 * | 6/2011 | Yamada et al. | ............... | 257/784 |
| 8,222,651 B2 * | 7/2012 | Kanazawa et al. | ............ | 257/666 |
| 8,237,232 B2 * | 8/2012 | Uno et al. | ...................... | 257/401 |
| 2002/0011350 A1 * | 1/2002 | Kono | ............................ | 174/260 |
| 2002/0140079 A1 * | 10/2002 | Takeyama | ..................... | 257/698 |
| 2009/0140414 A1 * | 6/2009 | Soyano et al. | ................. | 257/698 |
| 2009/0261472 A1 * | 10/2009 | Bayerer | ........................ | 257/719 |
| 2010/0289137 A1 * | 11/2010 | Eom et al. | ..................... | 257/712 |
| 2011/0116236 A1 * | 5/2011 | Akahori | ........................ | 361/704 |
| 2011/0186999 A1 * | 8/2011 | Momose et al. | ............. | 257/741 |
| 2011/0241198 A1 * | 10/2011 | Azuma | ......................... | 257/696 |
| 2011/0260315 A1 * | 10/2011 | Yamaguchi et al. | .......... | 257/696 |

(Continued)

FOREIGN PATENT DOCUMENTS

| | | | |
|---|---|---|---|
| JP | 2006-109576 | | 4/2006 |
| JP | 2006-109576 A | * | 4/2006 |
| JP | 2007-173272 A | | 7/2007 |
| JP | 2009-141000 | * | 6/2009 |

OTHER PUBLICATIONS

Applicant-provided Office Action issued for related Japanese Patent Application No. 2011-117283, dated Sep. 11, 2012, and its English summary, also provided by the Applicant.

(Continued)

*Primary Examiner* — A O Williams
(74) *Attorney, Agent, or Firm* — Ladas & Parry, LLP (57) ABSTRACT

Disclosed herein are a power package module and a method for fabricating the same, including: a base substrate; a plurality of high power chips and a plurality of low power chips electrically connected to the base substrate; and a plurality of metal lead plates electrically connecting the plurality of high power chips and the plurality of low power chips to the base substrate.

28 Claims, 7 Drawing Sheets

(56) References Cited

U.S. PATENT DOCUMENTS

2011/0298121 A1* 12/2011 Nishibori et al. .............. 257/713
2012/0098138 A1* 4/2012 Oka et al. ...................... 257/773
2012/0106109 A1* 5/2012 Kim et al. ...................... 361/771
2012/0181682 A1* 7/2012 Soyano ......................... 257/692
2012/0181706 A1* 7/2012 Zeng et al. .................... 257/777
2012/0267682 A1* 10/2012 Kanazawa et al. ............ 257/140

OTHER PUBLICATIONS

Applicant-provided Office Action issued for related Japanese Patent Application No. 2011-117283, dated Feb. 5, 2013, and its English summary, also provided by the Applicant.

* cited by examiner

FIG.1

Prior art

POWER PACKAGE MODULE WITH LOW AND HIGH POWER CHIPS AND METHOD FOR FABRICATING THE SAME

CROSS REFERENCE TO RELATED APPLICATION

This application claims the benefit of Korean Patent Application No. 10-2010-0107563, filed on Nov. 1, 2010, entitled "Power Package Module And A Fabricating Method The Same" which is hereby incorporated by reference in its entirety into this application.

BACKGROUND OF THE INVENTION

1. Technical Field

The present invention relates to a power package module and a method for fabricating the same.

2. Description of the Related Art

Generally, a semiconductor package includes a single or a plurality of semiconductor chips mounted on a lead frame or a printed circuit board and has the inside thereof protect by sealing them with a sealing resin, and is then coupled with a mother board or a printed circuit board for a system.

However, with the recent rapid progress of a high-speed, high-volume, and high-integration of electronic equipment, there is a demand for compact and light power device used in automobiles, industrial equipment, and home appliances at low costs. One method to meet the demand is to configure a power module package using a method of mounting a plurality of semiconductor chips on a single semiconductor package. The power module package includes a power circuit chip and a control chip and in particular, the power circuit chip generates more heat as compared to other semiconductor chip. Therefore, effective radiation of the generated heat to the outside becomes an important issue in order to maintain high reliability for a long period.

Figure 1:
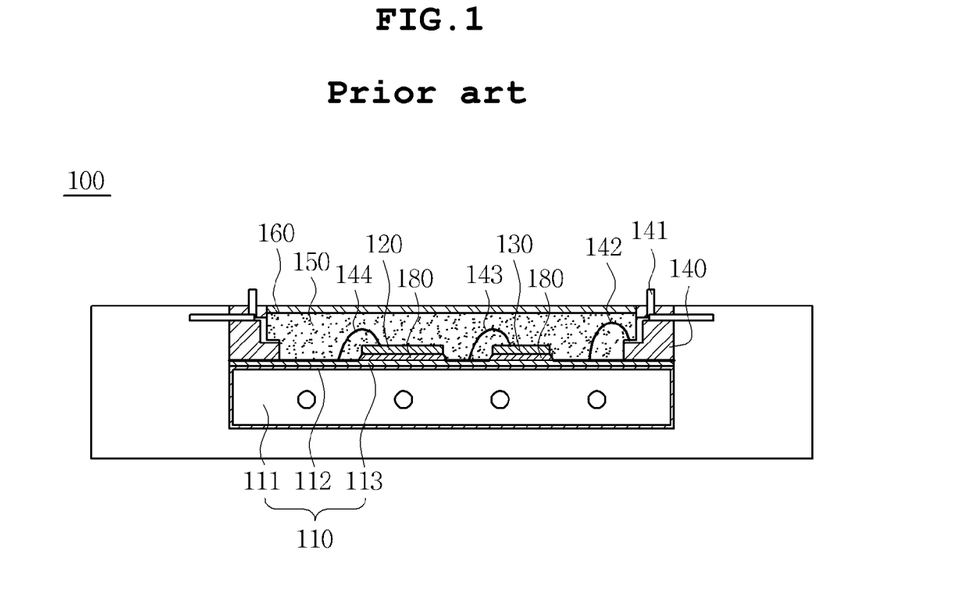
FIG. 1 is a cross-sectional view of a power package module according to the prior art.

FIG. 1 is a cross-sectional view of a power package module 100 according to the prior art. As shown in the figure, a power package module 100 according to the prior art is configured to include a base substrate 110, a high power chip 120, a low power chip 130, a housing 140, and a molding part 150.

The base substrate 110 is configured to include a metal layer 111, an anodizing layer 112, and a circuit layer 113. More specifically, the anodizing layer 112 is formed on the surface of the metal layer 111 by anodizing the metal layer 111 and then the circuit layer 113 is formed on the anodizing layer 112, thereby fabricating the base substrate 110. In addition, the circuit layer 113, a solder layer 180, and a high power chip 120 and a lower power chip 130 electrically connected through wires 143 and 144 are formed on the base substrate 110.

The housing 140 is formed to surround side surfaces of the base substrate 110, and a lead 141 connected to the circuit layer 113 of the base substrate 110 through a wire 142 is formed in the housing 140. In addition, a molding part 150 for fixing and protecting the base substrate 110 is formed in the housing 140 and a cover 160 is formed on the upper portion of the molding part 150.

However, in the power package module 100 according to the prior art, thermal stress generated from the high power chip 120 and the low power chip 130 is transferred to the base substrate 110 in a vertical direction through the solder layer 180, such that warpage of the base substrate 110 is caused by thermal conductivity. As a result, a problem arises in that the anodizing layer 112 as well as the base substrate 110 are bent or distorted.

In addition, when fabricating the high power package module 100, at least two to ten or more wires should be connected for each chip, such that a long period of process operation is required.

SUMMARY OF THE INVENTION

The present invention has been made in an effort to provide a power package module having improved radiation effects and reliability by reducing warpage phenomena of a base substrate and high power chips and low power chips bonded to the base substrate generated due to thermal stress, and a method for fabricating the same.

According to a preferred embodiment of the present invention, there is provided a power package module, including: a base substrate; a plurality of high power chips mounted on the base substrate to be electrically connected to the base substrate; a plurality of low power chips mounted on the base substrate to be electrically connected to the base substrate; and a plurality of metal lead plates electrically connecting the plurality of high power chips and the plurality of low power chips to the base substrate.

The plurality of high power chips and the plurality of low power chips may be sequentially mounted on the base substrate in an alternating manner.

The metal lead plate may electrically connect the two high power chips and the two low power chips sequentially mounted on the base substrate in an alternating manner.

The metal lead plate may include: a high power chip connection part connected to the high power chip; a low power chip connection part connected to the low power chip; a base substrate connection part connected to the base substrate; a first connection part connecting the high power chip connection part to the base substrate connection part; a second connection part connecting the low power chip connection part to the base substrate connection part; and a third connection part connecting the high power chip to the low power chip.

The high power chip may be provided with a groove for wire bonding.

The first connection part, the second connection part, and the third connection part may have a bending portion.

The high power chip may be an insulating gate bipolar transistor (IGBT) and the low power chip may be a diode.

The power package module may further include: a housing surrounding an outer peripheral surface and a side surface of the base substrate; a lead provided in the housing and electrically connected to the base substrate; a molding part filled in the base substrate so as to cover the high power chip, the low power chip, and the metal lead plate mounted on the base substrate; and a cover covering the molding part.

The power package module may further include an adhesive layer electrically connecting the metal lead plate to the base substrate, the high power chip, and the low power chip.

The adhesive layer may be a solder layer.

According to another preferred embodiment of the present invention, there is provided a method for fabricating a power package module, including: preparing a base substrate; mounting a plurality of high power chips and a plurality of low power chips, electrically connected to the base substrate; and mounting a plurality of metal lead plates on the base substrate, the plurality of metal lead plates connecting the plurality of high power chips and the plurality of low power chips to the base substrate.

The preparing the base substrate may further include forming an anodizing layer by anodizing a metal layer and forming a circuit layer on one surface of the anodizing layer to form the circuit layer as an anodizing substrate.

The high power chip may be an insulating gate bipolar transistor (IGBT), and the lower power chip may be a diode.

The method for fabricating a power package module may further include: forming a housing surrounding an outer peripheral surface and a side surface of the base substrate and mounting a lead connected to the base substrate on the housing; mounting a molding part filled in the housing so as to cover the plurality of high power chips, the plurality of low power chips, and the plurality of metal lead plates, mounted on the base substrate; and mounting a cover on the molding part.

The mounting the plurality of high power chips and the plurality of low power chips may further include: mounting an adhesive layer on the base substrate by a screen printing method; and mounting the plurality of high power chips and the plurality of low power chips electrically connected to the base substrate through the adhesive layer on the base substrate.

DESCRIPTION OF THE PREFERRED EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, terms used in the specification, 'first', 'second', etc. can be used to describe various components, but the components are not to be construed as being limited to the terms. The terms are only used to differentiate one component from other components. Further, when it is determined that the detailed description of the known art related to the present invention may obscure the gist of the present invention, a detailed description thereof will be omitted.

Hereinafter, preferred embodiments of the present invention will be described in detail with reference to the accompanying drawings.

Structure of Power Package Module

Figure 2:
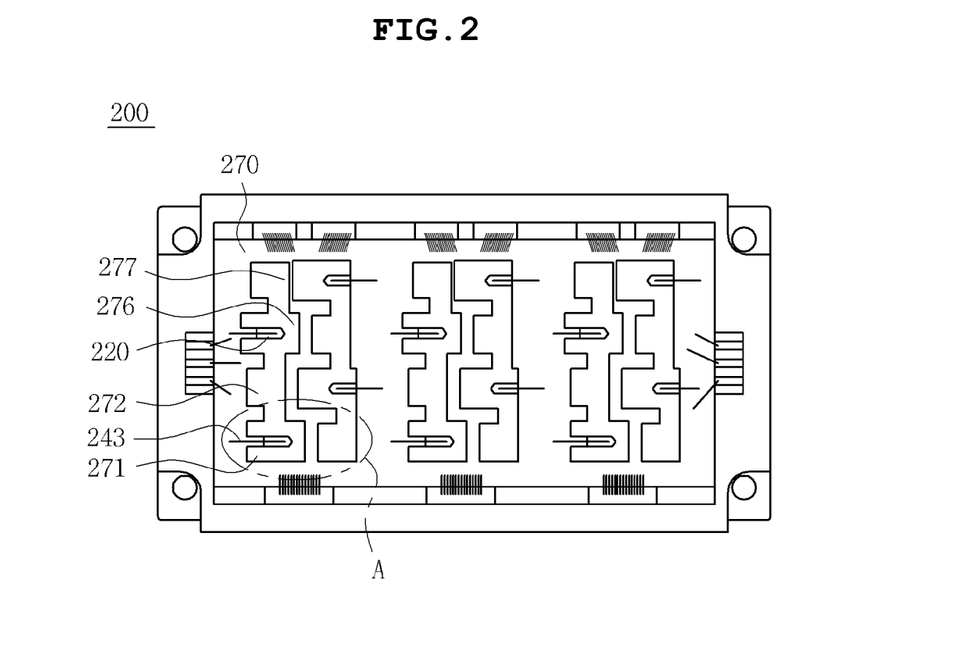
FIG. 2 is a plan view of a power package module according to a preferred embodiment of the present invention.
Figure 3:
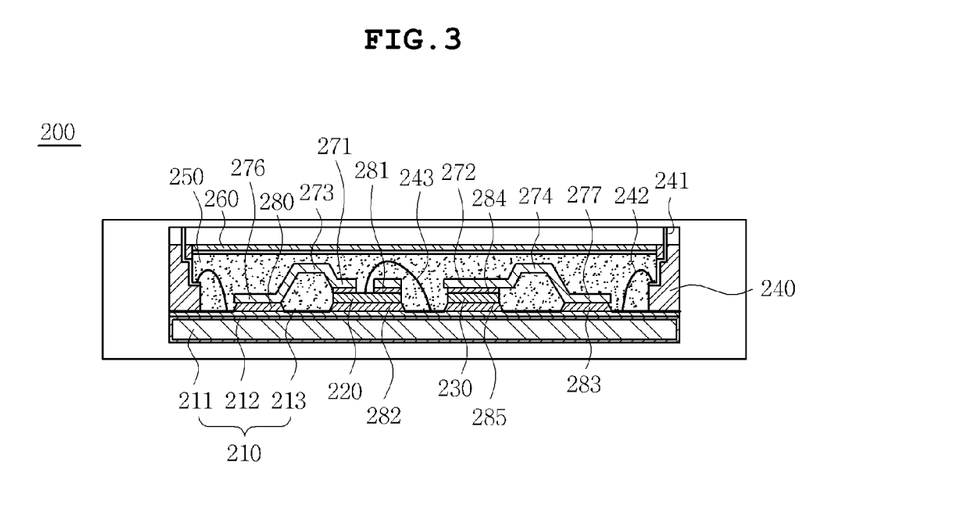
FIG. 3 is a cross-sectional view of an enlarged portion A of a power package module according to a preferred embodiment of the present invention.

FIG. 2 is a plan view of a power package module 200 according to a preferred embodiment of the present invention, and FIG. 3 is a cross-sectional view of an enlarged portion A of FIG. 2. As shown in the figures, the power module 200 according to the present embodiment is configured to include a base substrate 210, a plurality of high power chips 220 and a plurality of low power chips 230 formed on the base substrate 210, a plurality of metal lead plates 270 electrically connecting the plurality of high power chips 220 and the plurality of low power chips 230 to the base substrate 210.

An anodizing substrate (not shown) is preferably formed on the upper surface of the base substrate 210, wherein the anodizing substrate (not shown) is configured to include a metal layer 211, an anodizing layer 212, and a circuit layer 213.

Herein, the metal layer 211 may, for example, be made of aluminum. Aluminum is light and has excellent thermal conductivity. Therefore, when the metal layer 211 is made of aluminum, the base substrate 210 becomes light and heat generated from the high power chip 220 and the low power chip 230 is able to be rapidly discharged to the outside. However, the material of the metal layer 211 is not limited thereto but any material may be applied, if anodizing is available.

In addition, the anodizing layer 212 is a layer formed by anodizing the metal layer 211. When the metal layer 211 is made of aluminum, the anodizing layer 212 may be made of aluminum oxide ($Al_2O_3$). Further, the anodizing layer 212 may be entirely or partially formed on the surface of the metal layer 211.

The circuit layer 213 is a layer formed on the anodizing layer 212 formed on one surface thereof. The high power chip 220 and the low power chip 230 may be electrically connected to the circuit layer 213. Therefore, the circuit layer 213 is electrically connected to the high power chip 220 and the low power chip 230 to serve to transfer circuit signals, such that the high power chip 220 and the low power chip 230 are electrically connected to the base substrate 210.

Although the circuit layer 213 is shown not to be patterned in FIG. 3, it is for illustrative convenience and the circuit layer 213 is patterned.

The plurality of high power chips 220 and the plurality of low power chips 230 are mounted on the base substrate 210, wherein the high power chips 220 and the low power chips 230 are sequentially mounted in an alternating manner. Two high power chips and two low power chips are mounted in a single column on the base substrate 210, preferably, in the sequence of a high power chip, a low power chip, a high power chip, and a low power chip, or in the reverse sequence of a low power chip, a high power chip, a low power chip, and a high power chip.

Solder layers 282 and 285, which are adhesive layers, may, for example, be made of an electrical conductive material so as to electrically connect the circuit layer 213 to the plurality of high power chips 220 and the plurality of low power chips 230.

In addition, the high power chip 220 may, for example, be an insulating gate bipolar transistor (IGBT) that is a power device, and the low power chip 230 may, for example, be a diode that is a control device.

Figure 4:
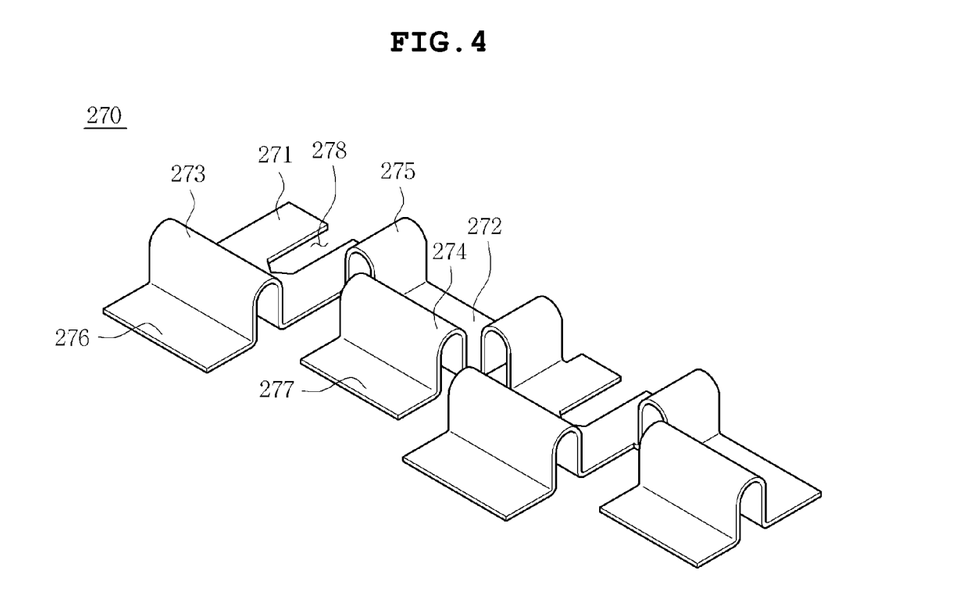
FIG. 4 is a perspective view of a metal lead plate according to a preferred embodiment of the present invention.
Figure 5:
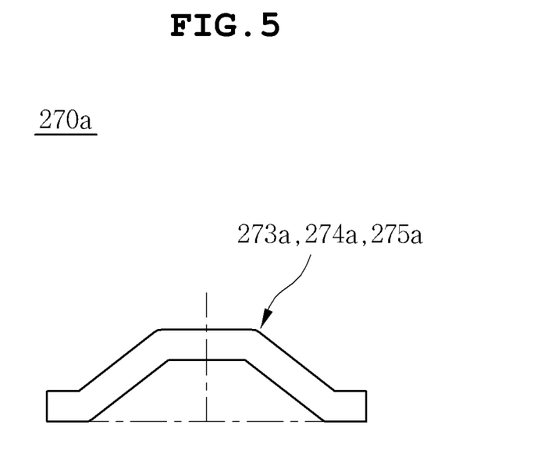
FIGS. 5 to 7 are cross-sectional views of a first connection part, a second connection part, and a third connection part according to a preferred embodiment of the present invention.
Figure 6:
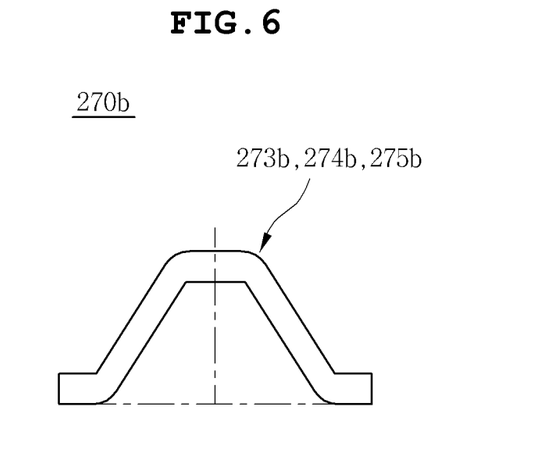
Figure 7:
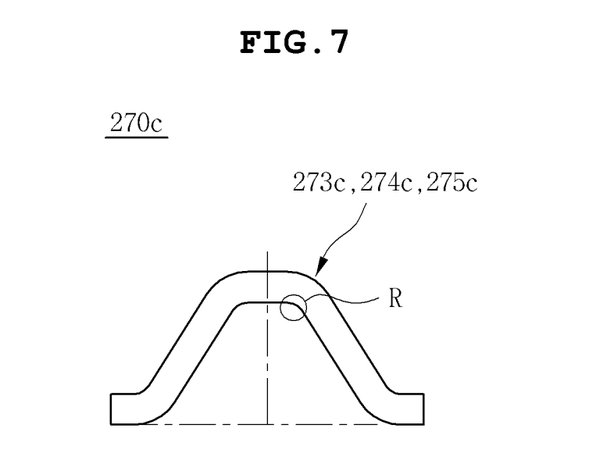

FIG. 4 is a perspective view of a metal lead plate 270 according to a preferred embodiment of the present invention, and FIGS. 5 to 7 are cross-sectional views of a first connection part 273, a second connection part 274, and a third connection part 275 according to a preferred embodiment of the present invention.

The metal lead plate 270 includes a high power chip connection part 271 connected to the high power chip 220, a low power chip connection part 272 connected to the low power chip 230, and base substrate connection parts 276 and 277 connecting the base substrate 210 so as to electrically connect the two high power chips 220 and the two low power chips 230 to the base substrate 210, the two high power chips 220 and the two low power chips 230 being sequentially mounted in a single column on the base substrate 210 in an alternating manner, preferably, in the sequence of a high power chip, a low power chip, a high power chip, and a low power chip, or in the reverse sequence of a low power chip, a high power chip, a low power chip, and a high power chip.

In addition, the metal lead plate 270 includes a first connection part 273 connecting the high power chip connection part 271 to the base substrate connection part 276, a second connection part 274 connecting the low power chip connection part 272 to the base substrate connection part 277, and a third connection part 275 connecting the high power chip 220 to the low power chip 230, the high power chip connection part 271 being provided with a groove 278 for wire bonding.

The metal lead plate 270 may be made of Cu, Ag, Al or an alloy material, having excellent thermal conductivity and electrical conductivity.

The high power chip connection part 271 of the metal lead plate 270 is mounted on the high power chip 220, wherein a solder layer 281 made of an electrical conductive material may also be formed between the high power chip connection part 271 and the high power chip 220 by way of example, so that they may be electrically connected to each other.

In addition, the low power chip connection part 272 of the metal lead plate 270 is mounted on the low power chip 230, wherein a solder layer 284 made of an electrical conductive material may also be formed between the low power chip connection part 272 and the low power chip 230 by way of example, so that they may be electrically connected to each other.

As the base substrate connection parts 276 and 277 of the metal lead plate 270 are connected to the base substrate 210, the plurality of high power chips 220 and the plurality of low power chips 230 are electrically connected to the base substrate 210 by the metal lead plate 270.

In addition, solder layers 280 and 283 made of an electrical conductive material may also be formed between the base substrate connection parts 276 and 277 and the base substrate 210 by way of example, so that they may be electrically connected to each other.

Thereby, the single metal lead plate 270 is electrically connected to the two high power chips 220, the two low power chips 230, and the base substrate 210.

When thermal stress is generated from the high power chips 220 and the low power chip 230 to generate a heat transfer to the metal lead plate 270, the metal lead plate 270 is affected by the repetitive expansion/contraction phenomenon due to the thermal stress.

However, as shown in FIG. 4, the third connection part 275 of the metal lead plate 270 has a curved surface shape bending portion to have a radiation effect that the thermal stress generated from the high power chip 220 and the low power chip 230 is distributed in two directions of the bending portion. As a result, the third connection part 275 prevents the metal lead plate 270, the high power chip 220, and the low power chip 230 from being bent due to the thermal stress, thereby making it possible to prevent the metal lead plate 270, the high power chip 220, and the low power chip 230 from being damaged.

In addition, the thermal stress generated from the high power chip 220 and the low power chip 230 is transferred to the circuit layer 213, the anodizing layer 212, and the metal layer 211 to subsequently generate a heat transfer to the base substrate 210. Therefore, the base substrate 210 is also affected by the repetitive expansion/contraction phenomenon due to the thermal stress, such that that the base substrate 210 is bent.

However, as shown in FIG. 4, the first connection part 273 and the second connection part 274 of the metal lead plate 270 have a curved surface shaped bending portion to have a radiation effect that the thermal stress is distributed in two directions of the bending portion. As a result, the first connection part 273 and the second connection part 274 prevent the base substrate 210 from being bent due to the thermal stress, thereby making it possible to prevent the base substrate 210 and the metal lead plate 270 from being damaged.

As shown in FIGS. 5 to 7, the first connection parts $273a$, $273b$, and $273c$, the second connection parts $274a$, $274b$, and $274c$, and the third connection parts $275a$, $275b$, and $275c$ of the metal lead plates $270a$, $270b$, and $270c$ have various shapes of the bending portions. Therefore, an expansion/contraction phenomenon due to thermal stress generated by a difference in thermal expansion coefficients between the high power chip 220 and the low power chip 230 and an expansion/contraction phenomenon due to thermal stress generated by a difference in thermal expansion coefficients between the high power chip 220 and the low power chip 230 and the base substrate 210 are reduced by the radiation effects of the bending portion, thereby making it possible to prevent the high power chip 220, the low power chip 230, and the base substrate 210 from being damaged.

In addition, as shown in FIG. 7, a round R is further formed in the first connection part $273c$, the second connection part $274c$, and the third connection part $275c$ to improve radiation effects, thereby making it possible to further reduce the expansion/contraction phenomenon.

Furthermore, a housing 240, a lead 241, a molding part 250, and a cover 260 may further be formed on the power package module 200.

In this case, the lead 241 is fixedly mounted on the housing 240 to electrically connect the circuit layer 213 of the base substrate 210 to the outside. In addition, the lead 241 may be an electrical conductive metal plate, such as gold, silver, copper, nickel, or the like, by way of example. Meanwhile, FIG. 2 shows a case in which the lead 241 is connected to the circuit layer 213 through a wire 242; however, this is merely an example, and any configuration capable of connecting the lead 241 to the circuit layer 213 may be used.

In addition, FIG. 2 shows a case in which the housing 240 is mounted on the base substrate 210; however, this is merely an example, and the housing 240 may also be mounted at a side surface of the base substrate 210.

Therefore, the housing 240 is a member that is formed at a side surface of the base substrate 210 or on the base substrate 210 to protect the power package module 200 including the high power chip 220 and the low power chip 230. In addition, the housing 240 includes the lead 241 connecting the inside of the power package module 200 to the outside thereof, such that it may preferably be made of an insulating material so as not to be short-circuited.

The molding part 250 is filled in the housing 240, thereby making it possible to fix the base substrate 210 to the high power chip 220 and the low power chip 230. In addition, the molding part 250 may be preferably formed up to the upper surface of the base substrate 210, while including the high power chip 220 and the low power chip 230, so as to sufficiently protect the power package module 200 from external impact. Meanwhile, the molding part 250 may, for example, be made of epoxy mold compound (EMC) or silicon gel.

The cover 260 is a member that is formed on the upper portion of the molding part 250 so as to protect the power package module 200 from external impact. The cover 260 may be made of the same material as the housing 240.

In addition, a heat sink (not shown) may be bonded to the lower portion of the base substrate 210, thereby making it possible to further improve the radiation effects.

Method for Fabricating Power Package Module

FIGS. 8 to 15 are process cross-sectional views showing a method for manufacturing a power package module 200 of FIGS. 2 and 3. Hereinafter, the method for fabricating the power package module 200 according to a preferred embodiment of the present invention will be described with reference to the figures.

Figure 8:
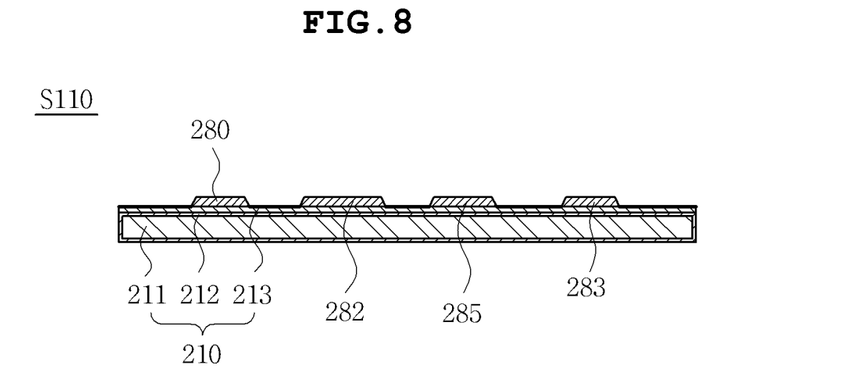
FIGS. 8 to 15 are process cross-sectional views showing a method for manufacturing a power package module according to a preferred embodiment of the present invention.

First, as shown in FIG. 8, in order to form a base substrate 210, a metal layer 211 is anodized to form an anodizing layer 212, as a preferred embodiment of the present invention.

In this case, the metal layer 211 may be made of aluminum, and the anodizing layer 212 may be made of aluminum oxide ($Al_2O_3$). In addition, after the metal layer 211 is put in an electrolyte solution such as boric acid, phosphoric acid, sulfuric acid, chromic acid, or the like, the metal layer 211 is applied with positive electricity and the electrolyte solution is applied with negative electricity to grow an oxide film performing an electrical insulation over the surface of the metal layer 211, thereby making it possible to form the oxidizing layer 212.

Then, a circuit layer 213 is formed on one surface of the oxidizing layer 212 to prepare an oxidizing substrate (not shown) and a base substrate 210 configured of the oxidizing substrate (not shown) is formed.

In addition, the circuit layer 213 may, for example, be formed by a well-known method such as a semi-additive process (SAP) or the like. In addition, the circuit layer 213 may be made of a metal having excellent electrical conductivity and thermal conductivity, for example, copper.

Then, a plurality of solder layers 280, 282, 283, and 285, which are adhesive layers, are formed on the base substrate 210.

Figure 9:
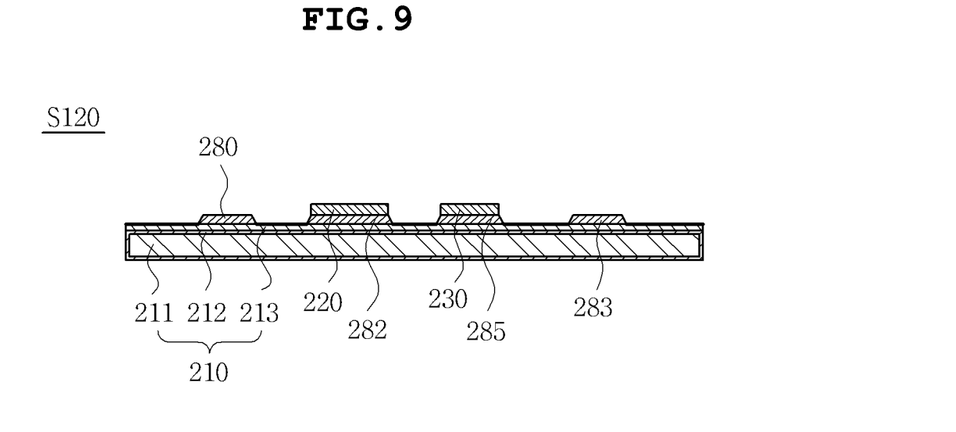

Then, as shown in FIG. 9, the plurality of high power chips 220 and the plurality of low power chips 230 are sequentially mounted on the base substrate 210 in an alternating manner. Two high power chips and two low power chips are mounted in single column on the base substrate 210, preferably, in the sequence of a high power chip, a low power chip, a high power chip, and a low power chip, or in the reverse sequence of a low power chip, a high power chip, a low power chip, and a high power chip.

In this case, the plurality of high power chips 220 and the plurality of low power chips 230 may be formed directly on the circuit layer 213, or an adhesive layer having electrical conductivity, for example, the solder layers 282 and 285, is interposed between the high power chips 220 and the low power chips 230 and the circuit layer 213, such that the high power chips 220 and the low power chips 230 may be electrically connected to the base substrate 210.

In addition, the solder layers 282 and 285, which are the adhesive layers, are first printed on the anodizing substrate (not shown) by a screen printing method, thereby connecting the high power chips 220 to the low power chips 230.

Figure 10:
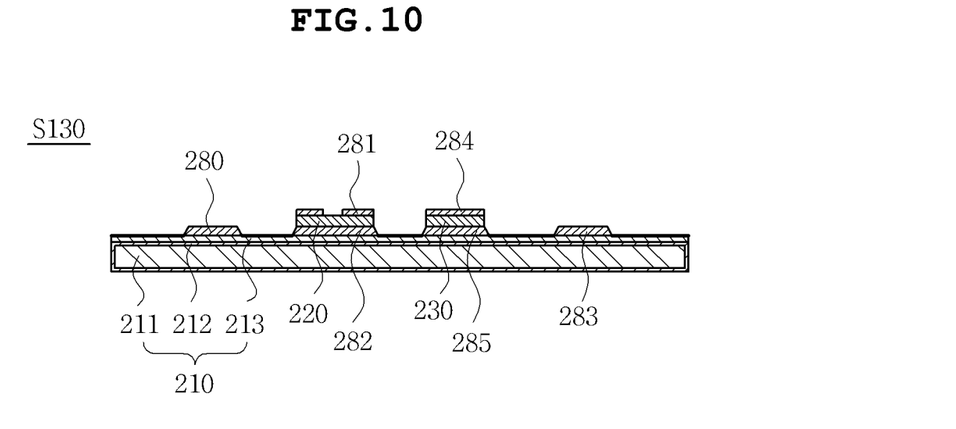

Then, as shown in FIG. 10, the solder layer 281, which is the adhesive layer, is formed on the high power chip 220, and the solder layer 284, which is the adhesive layer, is formed on the low power chip 230.

Figure 11:
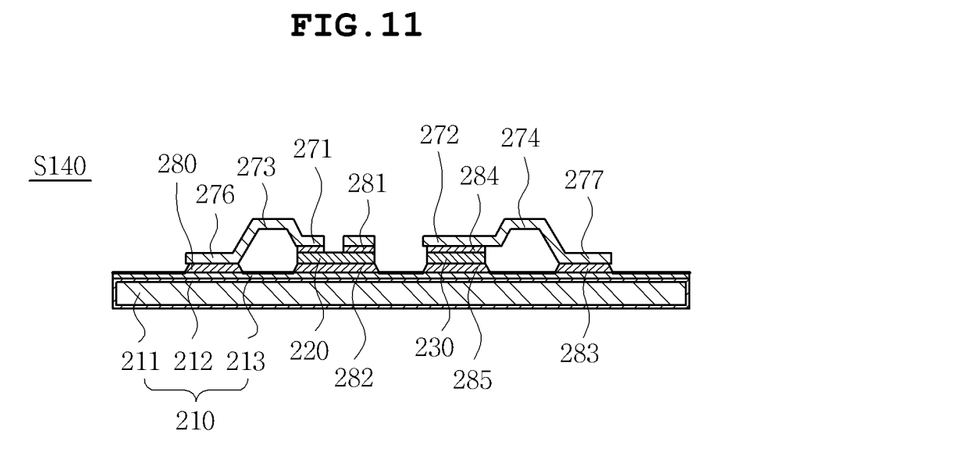

Then, as shown in FIG. 11, the metal lead plate 270 is mounted on the solder layers 280, 281, 283, and 284, which are the adhesive layers, wherein a high power chip connection part 271 of the metal lead plate 270 is mounted on the solder layer 281 of the high power chip 220 and a base substrate connection part 276 thereof is mounted on the solder layer 280.

In addition, a low power chip connection part 272 of the metal lead plate 270 is mounted on the solder layer 284 on the lower power chip 230, and a base substrate connection part 277 thereof is mounted on the solder layer 283.

Thereby, the metal lead plate 270 includes both the high power chip 220 and the low power chip 230 formed on one surface of the circuit layer 213 of the base substrate 210, thereby electrically connecting them to the base substrate 210.

Figure 12:
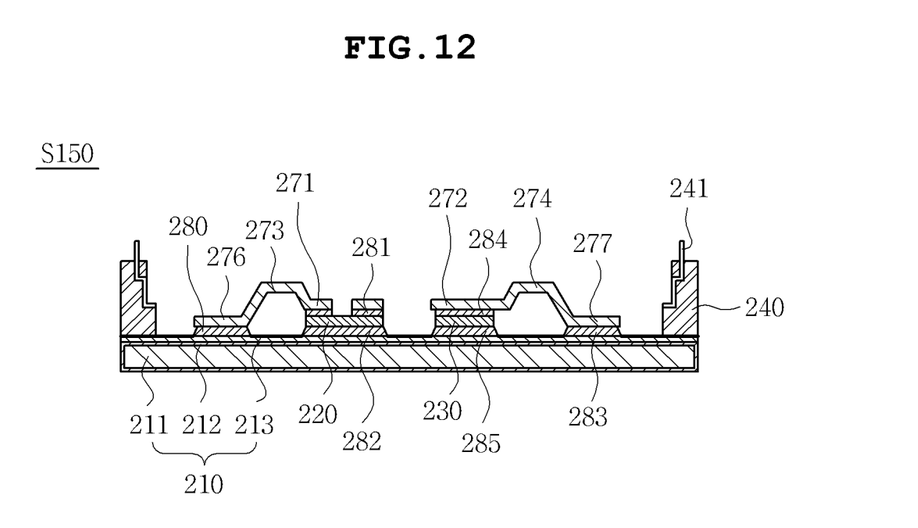
Figure 13:
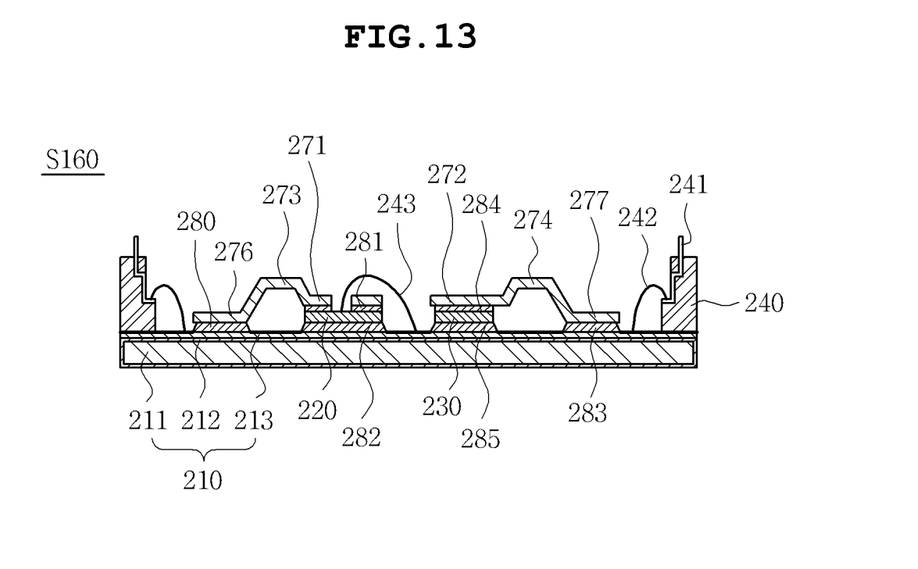

Then, as shown in FIGS. 12 and 13, a housing 240 provided with a lead 241 is coupled to the base substrate 210. In addition, the lead 241 provided in the housing 240 is connected to the circuit layer 213 of the base substrate 210 through a wire 242, and the connecting the high power chip 220 is connected to the base substrate 210 by connecting a wire 423 through a groove 278 formed in the high power chip connection part 271.

Figure 14:
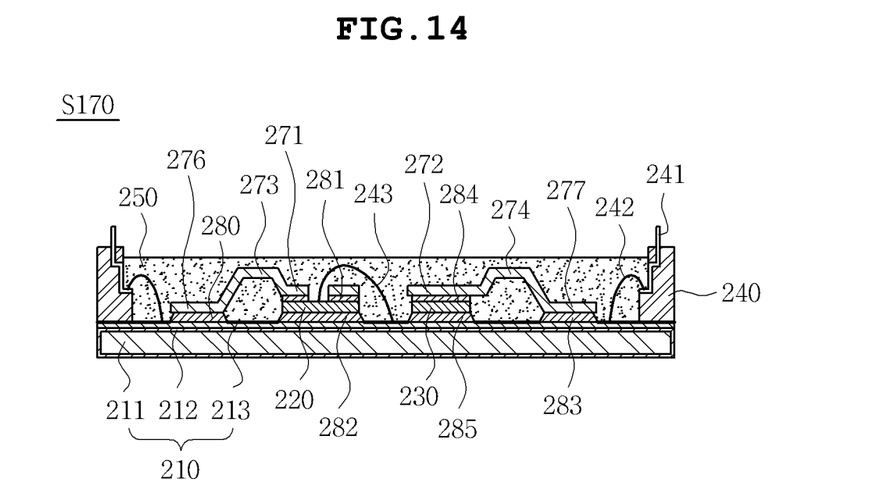

Then, as shown in FIG. 14, a molding part 250 is formed in the housing 240.

In this case, the molding part 250 may be formed by covering all of the upper surfaces of the high power chip 220, the low power chip 230, and the base substrate 210, and the molding part 250 may, for example, be made of silicon gel.

Figure 15:
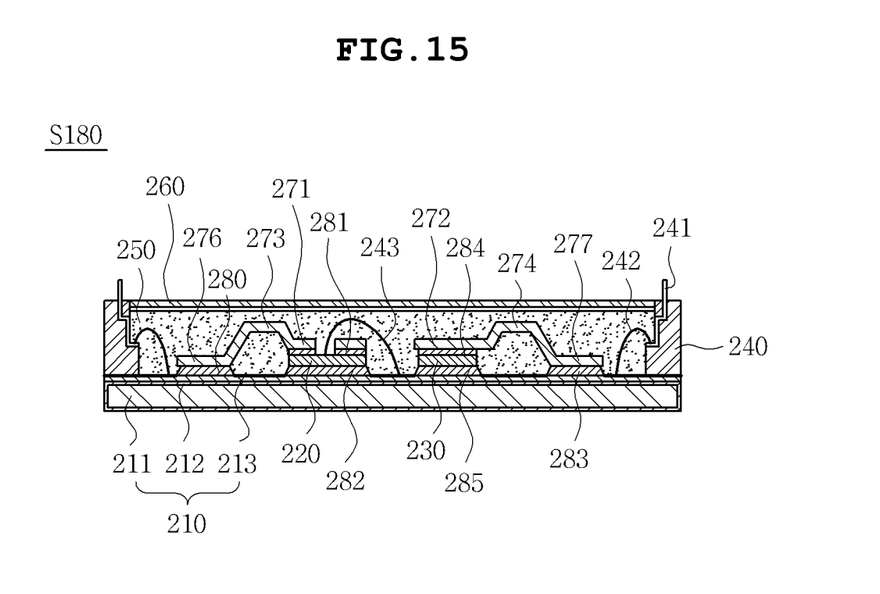

Then, as shown in FIG. 15, a cover 260 is formed on the upper portion of the molding part 250.

Thereby, a power package module 200, which is a preferred embodiment of the present invention as shown in FIGS. 2 and 3, is fabricated through the fabricating process as described above.

The power package module and the method for fabricating the same according to the present invention includes the metal lead plates having the bending portions connecting the plurality of high power chips and the plurality of low power chips to the base substrate, thereby making it possible to reduce a warpage phenomenon of the metal lead plates connected to the high power chips and the low power chips as well as a warpage phenomenon of the base substrate caused by thermal stress generated from the high power chips and the low power chips.

In addition, the bending portion of the metal lead plate radiate heat generated from the high power chip and the low power chip, thereby having an effect to lower a bonding temperature between the chips and between the chip and the base substrate.

In addition, the single metal lead plate electrically connects the plurality of high power chips and the plurality of low power chips to the base substrate, thereby making it possible to shorten a process time as compared to the existing wire bonding process.

In addition, the plurality of high power chips and the plurality of low power chips are bonded by the single metal lead plate, such that current can be uniformly distributed to the plurality of high power chips and the plurality of low power chips bonded to the metal lead plate, thereby having an effect to expand a safe of ares (SOA) region.

Although the preferred embodiments of the present invention have been disclosed for illustrative purposes, they are for specifically explaining the present invention and thus a power module and a method for fabricating the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A power package module, comprising:
   a base substrate;
   a plurality of high power chips mounted on the base substrate to be electrically connected to the base substrate;
   a plurality of low power chips mounted on the base substrate to be electrically connected to the base substrate;
   a plurality of metal lead plates electrically connecting the plurality of high power chips, the plurality of low power chips and the base substrate; and
   an adhesive layer electrically connecting the metal lead plate to the base substrate, the high power chip, and the low power chip.

2. The power package module as set forth in claim 1, wherein the plurality of high power chips and the plurality of low power chips are sequentially mounted on the base substrate in an alternating manner.

3. The power package module as set forth in claim 1, wherein the metal lead plate electrically connects the two high power chips and the two low power chips sequentially mounted on the base substrate in an alternating manner to the base substrate.

4. The power package module as set forth in claim 1, wherein the metal lead plate includes:
   a high power chip connection part connected to the high power chip;
   a low power chip connection part connected to the low power chip;
   a base substrate connection part connected to the base substrate;
   a first connection part connecting the high power chip connection part to the base substrate connection part;
   a second connection part connecting the low power chip connection part to the base substrate connection part; and
   a third connection part connecting the high power chip to the low power chip.

5. The power package module as set forth in claim 4, wherein the high power chip is provided with a groove for wire bonding.

6. The power package module as set forth in claim 4, wherein the first connection part, the second connection part, and the third connection part have a bending portion.

7. The power package module as set forth in claim 1, wherein the high power chip is an insulating gate bipolar transistor (IGBT) and the low power chip is a diode.

8. The power package module as set forth in claim 1, further comprising:
   a housing surrounding an outer peripheral surface and a side surface of the base substrate;
   a lead provided in the housing and electrically connected to the base substrate;
   a molding part filled in the base substrate so as to cover the high power chip, the low power chip, and the metal lead plate mounted on the base substrate; and
   a cover covering the molding part.

9. The power package module as set forth in claim 1, wherein the adhesive layer is a solder layer.

10. A method for fabricating a power package module, comprising:
    preparing a base substrate;
    mounting a plurality of high power chips and a plurality of low power chips, electrically connected to the base substrate; and
    mounting a plurality of metal lead plates on the base substrate, the plurality of metal lead plates connecting the plurality of high power chips and the plurality of low power chips to the base substrate,
    wherein the preparing the base substrate comprises forming an anodizing layer by anodizing a metal layer and forming a circuit layer on one surface of the anodizing layer to form the circuit layer as an anodizing substrate.

11. The method for fabricating a power package module as set forth in claim 10, wherein the high power chip is an insulating gate bipolar transistor (IGBT), and the lower power chip is a diode.

12. The method for fabricating a power package module as set forth in claim 10, further comprising:
    forming a housing surrounding an outer peripheral surface and a side surface of the base substrate and mounting a lead connected to the base substrate on the housing;
    mounting a molding part filled in the housing so as to cover the plurality of the high power chips, the plurality of low power chips, and the plurality of metal lead plates, mounted on the base substrate; and
    mounting a cover on the molding part.

13. The method for fabricating a power package module as set forth in claim 10, wherein the mounting the plurality of high power chips and the plurality of low power chips further includes:
    mounting an adhesive layer on the base substrate by a screen printing method; and
    mounting the plurality of high power chips and the plurality of low power chips electrically connected to the base substrate through the adhesive layer on the base substrate.

14. The method for fabricating a power package module as set forth in claim 13, wherein the adhesive layer is a solder layer.

15. A power package module, comprising:
    a base substrate;
    a plurality of high power chips mounted on the base substrate to be electrically connected to the base substrate;
    a plurality of low power chips mounted on the base substrate to be electrically connected to the base substrate; and
    a plurality of metal lead plates formed in a body and electrically connecting the base substrate, the plurality of high power chips and the plurality of low power chips,
    wherein the plurality of high power chips and the plurality of low power chips are sequentially mounted on the base substrate in an alternating manner, and
    wherein the metal lead plate comprises
    a high power chip connection part connected to the high power chip;
    a low power chip connection part connected to the low power chip;
    a base substrate connection part connected to the base substrate;

a first connection part connecting the high power chip connection part to the base substrate connection part;

a second connection part connecting the low power chip connection part to the base substrate connection part; and a third connection part connecting the high power chip to the low power chip; and wherein the first connection part, the second connection part, and the third connection part have a bending portion.

16. The power package module as set forth in claim 15, wherein the metal lead plate electrically connects the two high power chips and the two low power chips sequentially mounted on the base substrate in an alternating manner to the base substrate.

17. The power package module as set forth in claim 15, wherein the high power chip is provided with a groove for wire bonding.

18. The power package module as set forth in claim 15, wherein the bending portion has a curved surface shape.

19. The power package module as set forth in claim 15, wherein the high power chip is an insulating gate bipolar transistor (IGBT) and the low power chip is a diode.

20. The power package module as set forth in claim 15, further comprising:

a housing surrounding an outer peripheral surface and a side surface of the base substrate;

a lead provided in the housing and electrically connected to the base substrate;

a molding part filled in the base substrate so as to cover the high power chip, the low power chip, and the metal lead plate mounted on the base substrate; and a cover covering the molding part.

21. The power package module as set forth in claim 15, further comprising an adhesive layer electrically connecting the metal lead plate to the base substrate, the high power chip, and the low power chip.

22. The power package module as set forth in claim 21, wherein the adhesive layer is a solder layer.

23. A method for fabricating a power package module, comprising:

preparing a base substrate;

sequentially mounting a plurality of high power chips and a plurality of low power chips in an alternating manner, electrically connected to the base substrate; and mounting a plurality of metal lead plates on the base substrate, wherein the plurality of metal lead plates are formed in a body and electrically connect the plurality of high power chips and the plurality of low power chips to the base substrate.

24. The method for fabricating a power package module as set forth in claim 23, wherein the preparing the base substrate further includes forming an anodizing layer by anodizing a metal layer and forming a circuit layer on one surface of the anodizing layer to form the circuit layer as an anodizing substrate.

25. The method for fabricating a power package module as set forth in claim 23, wherein the high power chip is an insulating gate bipolar transistor (IGBT), and the lower power chip is a diode.

26. The method for fabricating a power package module as set forth in claim 23, further comprising:

forming a housing surrounding an outer peripheral surface and a side surface of the base substrate and mounting a lead connected to the base substrate on the housing;

mounting a molding part filled in the housing so as to cover the plurality of the high power chips, the plurality of low power chips, and the plurality of metal lead plates, mounted on the base substrate; and mounting a cover on the molding part.

27. The method for fabricating a power package module as set forth in claim 23, wherein the mounting the plurality of high power chips and the plurality of low power chips further includes:

mounting an adhesive layer on the base substrate by a screen printing method; and mounting the plurality of high power chips and the plurality of low power chips electrically connected to the base substrate through the adhesive layer on the base substrate.

28. The method for fabricating a power package module as set forth in claim 27, wherein the adhesive layer is a solder layer.

* * * * *